United States Patent
Zuo et al.

(10) Patent No.: US 10,497,636 B2
(45) Date of Patent: Dec. 3, 2019

(54) PASSIVATION FOR SILICON CARBIDE (SIC) DEVICE AND METHOD FOR FABRICATING SAME

(71) Applicants: Zheng Zuo, Culver City, CA (US); Bochao Huang, Chino, CA (US); Ruigang Li, Fremont, CA (US); Da Teng, Culver City, CA (US)

(72) Inventors: Zheng Zuo, Culver City, CA (US); Bochao Huang, Chino, CA (US); Ruigang Li, Fremont, CA (US); Da Teng, Culver City, CA (US)

(73) Assignee: AZ Power Inc., Culver City, CA (US)

( * ) Notice: Subject to any disclaimer, the term of this patent is extended or adjusted under 35 U.S.C. 154(b) by 0 days.

(21) Appl. No.: 15/358,048

(22) Filed: Nov. 21, 2016

(65) Prior Publication Data

US 2017/0148645 A1    May 25, 2017

Related U.S. Application Data

(60) Provisional application No. 62/258,373, filed on Nov. 20, 2015.

(51) Int. Cl.
*H01L 23/31* (2006.01)

(52) U.S. Cl.
CPC ................ *H01L 23/3171* (2013.01)

(58) Field of Classification Search
CPC ........... H01L 23/3171; H01L 21/02225; H01L 23/291; H01L 21/045
See application file for complete search history.

(56) References Cited

U.S. PATENT DOCUMENTS

| | | | |
|---|---|---|---|
| 4,451,303 A * | 5/1984 | Hiraki | H01L 21/2256 257/E21.15 |
| 2006/0084256 A1* | 4/2006 | Cabral, Jr. | H01L 21/76843 438/597 |
| 2010/0025853 A1* | 2/2010 | Lindgren | G06F 17/5068 257/763 |
| 2015/0115273 A1* | 4/2015 | Yan | H01L 21/28176 257/72 |
| 2017/0316953 A1* | 11/2017 | Zhang | H01L 21/473 |

* cited by examiner

*Primary Examiner* — Thanh Y. Tran
(74) *Attorney, Agent, or Firm* — Che-Yang Chen; Law offices of Scott Warmuth

(57) ABSTRACT

A passivation method for a silicon carbide (SiC) surface may include steps of providing a silicon carbide surface, depositing a thin metal layer on the silicon carbide surface, forming a first passivation layer on the metal layer at low temperature, and generating a dielectric layer by a reaction between a gas/liquid ambient and the thin metal layer. In one embodiment, the thin metal layer is deposited on the silicon carbide surface by sputtering, e-beam evaporation, electroplating, etc. In another embodiment, the metal may include, but not limited to, aluminum, magnesium, etc. In a further embodiment, the passivation layer can be a low temperature oxide and/or nitride layer. In still a further embodiment, the dielectric layer can be aluminum oxide, titanium di-oxide etc. The passivation method for a silicon carbide (SiC) may further include a step of forming a second passivation layer on the first passivation layer.

10 Claims, 6 Drawing Sheets

PASSIVATION FOR SILICON CARBIDE (SiC) DEVICE AND METHOD FOR FABRICATING SAME

CROSS-REFERENCE TO RELATED APPLICATIONS

This application claims priority under 35 U.S.C. § 119 (e) to U.S. Provisional Patent Application Ser. No. 62/258,373, filed on Nov. 20, 2016, the entire contents of which are hereby incorporated by reference.

FIELD OF THE INVENTION

The present invention relates to a passivated semiconductor device and method for fabricating same, and more particularly to a passivated SiC device with enhanced electric characteristics and the method for fabricating same.

BACKGROUND OF THE INVENTION

In recent years, in order to achieve high breakdown voltage, low loss, and the like in a semiconductor device, silicon carbide has begun to be adopted as a material for the semiconductor device. Silicon carbide has a wide energy bandgap, high melting point, low dielectric constant, high breakdown-field strength, high thermal conductivity, and high saturation electron drift velocity compared to silicon. These characteristics would allow silicon carbide power devices to operate at higher temperatures, higher power levels, and with lower specific on-resistance than conventional silicon based power devices. Such devices must also exhibit low reverse leakage currents. Large reverse leakage currents may cause premature soft breakdown.

Surface passivation is needed for any semiconductor device to protect it from its external environment and for obtaining stable and repeatable electrical characteristics. Without surface passivation, the characteristics of devices such as diodes or rectifiers can be easily influenced by ambient moisture and impurities and thus become unstable.

Conventionally, surface passivation on the silicon carbide surface can be formed by various techniques, such as thermo oxidation, vapor oxide deposition, plasma enhanced vapor deposition, and the like. However, these deposition techniques have to be operated in a high temperature or a plasma excited environment, which may break the Si—C atomic bonds of the silicon carbide, so the C atoms become residues in the dielectric interface, which adversely affects the performance of the Si—C device.

For example, U.S. Pat. No. 5,629531 to Palmour discloses a method of obtaining high quality passivation layers on silicon carbide surfaces by oxidizing a sacrificial layer of a silicon-containing material on a silicon carbide portion of a device structure to substantially consume the sacrificial layer to produce an oxide passivation layer on the silicon carbide portion that is substantially free of dopants that would otherwise degrade the electrical integrity of the oxide layer. However, the oxide passivation layer is deposited onto the silicon carbide surface through a thermo oxidation process that has to be conducted in a high temperature, which may break the Si—C atomic bonds and adversely affects the performance of the Si—C device.

U.S. Pat. No. 6,246,076 to Lipkin et al. discloses a dielectric structure for silicon carbide-based semiconductor devices. In gated devices, the structure includes a layer of silicon carbide, a layer of silicon dioxide on the silicon carbide layer, a layer of another insulating material on the silicon dioxide layer, with the insulating material having a dielectric constant higher than the dielectric constant of silicon dioxide, and a gate contact to the insulating material. In other devices the dielectric structure forms an enhanced passivation layer or field insulator. However, the silicon oxide layer in Lipkin is still deposited onto the silicon carbide surface through a thermo oxidation process that has to be conducted in a high temperature.

Therefore, there remains a need for a new and improved fabrication technique to generate a passivated SiC device without breaking the Si—C atomic bonds to enhance the electrical characteristics and performance of the passivated SiC device.

SUMMARY OF THE INVENTION

It is an object of the present invention to provide a passivated SiC device with enhanced electrical characteristics.

It is another object of the present invention to provide a passivated SiC device in which the passivation layer is formed on a thin metal layer at low temperature, so the Si—C atomic bonds would not be broken.

It is a further object of the present invention to provide a passivated SiC device with at least one passivation layer and several other layers of dielectrics and polymers can be deposited if needed without damaging the Si—C atomic bonds.

In one aspect, a passivation method for a silicon carbide (SiC) surface may include steps of providing a silicon carbide surface, depositing a thin metal layer on the silicon carbide surface, forming a first passivation layer on the metal layer at low temperature, and generating a dielectric layer by a reaction between a gas/liquid ambient and the thin metal layer.

In one embodiment, the thin metal layer can be deposited on the silicon carbide surface by, but not limited to, sputtering, e-beam evaporation, electroplating, etc. In another embodiment, the metal may include, but not limited to, aluminum, magnesium, etc. In a further embodiment, the passivation layer can be a low temperature oxide and/or nitride layer. In still a further embodiment, the dielectric layer can be aluminum oxide, titanium di-oxide etc. The passivation method for a silicon carbide (SiC) may further include a step of forming a second passivation layer on the first passivation layer.

It is noted that the thickness of the thin metal layer is less than 10 nm. In one embodiment, it can range from 10 to 30 angstrom. In another embodiment, the thickness of the passivation layers is usually several microns. In a further embodiment, the thickness of the dielectric layer can be approximately doubled the thickness of the thin metal layer, e.g. 20 to 60 angstrom.

In another aspect, a silicon carbide semiconductor device may include a thin metal layer deposited on a silicon carbide surface, and a first passivation layer formed from the metal layer to generate a dielectric layer by the reaction between the metal layer and a gas/liquid ambient. In one embodiment, the thin metal layer can be deposited on the silicon carbide surface by, but not limited to, sputtering, e-beam evaporation, electroplating, etc. In another embodiment, the metal may include, but not limited to, aluminum, magnesium, etc. In a further embodiment, the passivation layer can be a low temperature oxide and/or nitride layer. In still a further embodiment, the dielectric layer can be an aluminum oxide layer created by oxidizing the aluminum layer. The silicon carbide semiconductor device may further include a second passivation layer deposited onto the first passivation layer.

It is noted that the thickness of the thin metal layer is less than 10 nm. In one embodiment, it can range from 10 to 30 angstrom. In another embodiment, the thickness of the passivation layers is usually several microns. In a further embodiment, the thickness of the dielectric layer can be approximately doubled the thickness of the thin metal layer, e.g. 20 to 60 angstrom.

DETAILED DESCRIPTION OF THE INVENTION

The detailed description set forth below is intended as a description of the presently exemplary device provided in accordance with aspects of the present invention and is not intended to represent the only forms in which the present invention may be prepared or utilized. It is to be understood, rather, that the same or equivalent functions and components may be accomplished by different embodiments that are also intended to be encompassed within the spirit and scope of the invention.

Unless defined otherwise, all technical and scientific terms used herein have the same meaning as commonly understood to one of ordinary skill in the art to which this invention belongs. Although any methods, devices and materials similar or equivalent to those described can be used in the practice or testing of the invention, the exemplary methods, devices and materials are now described.

All publications mentioned are incorporated by reference for the purpose of describing and disclosing, for example, the designs and methodologies that are described in the publications that might be used in connection with the presently described invention. The publications listed or discussed above, below and throughout the text are provided solely for their disclosure prior to the filing date of the present application. Nothing herein is to be construed as an admission that the inventors are not entitled to antedate such disclosure by virtue of prior invention.

As used in the description herein and throughout the claims that follow, the meaning of "a", "an", and "the" includes reference to the plural unless the context clearly dictates otherwise. Also, as used in the description herein and throughout the claims that follow, the terms "comprise or comprising", "include or including", "have or having", "contain or containing" and the like are to be understood to be open-ended, i.e., to mean including but not limited to. As used in the description herein and throughout the claims that follow, the meaning of "in" includes "in" and "on" unless the context clearly dictates otherwise.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Figure 1:
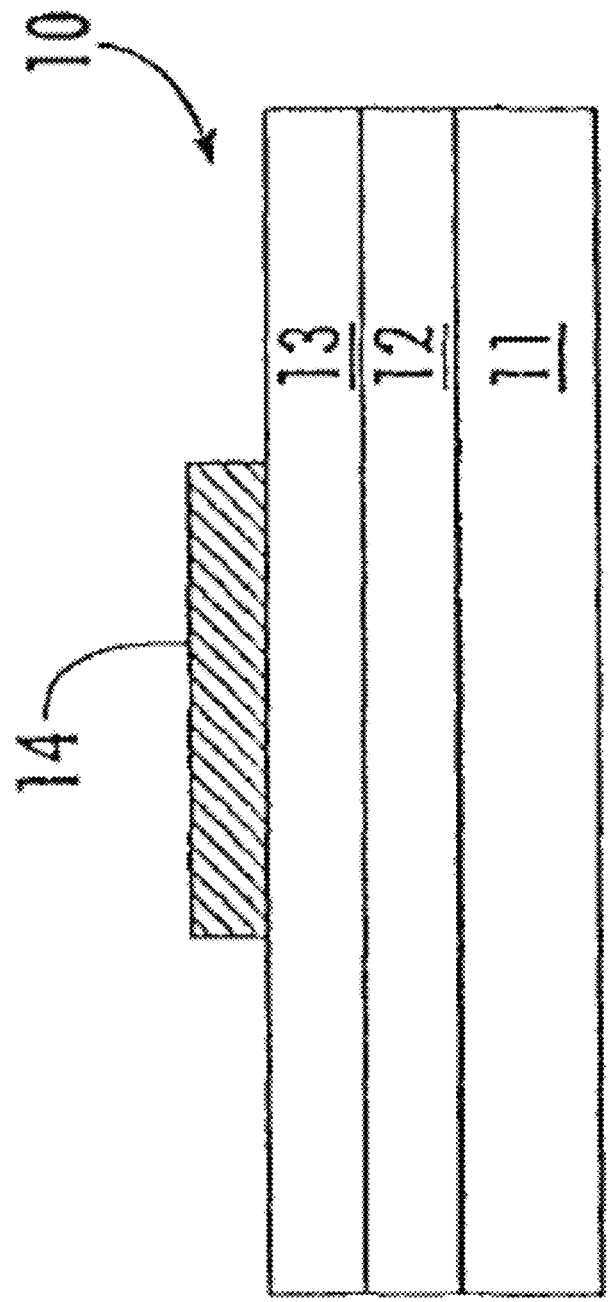
FIG. 1 is a prior art disclosing a thermo oxide deposited on the silicon carbide substrate surface.
Figure 2:
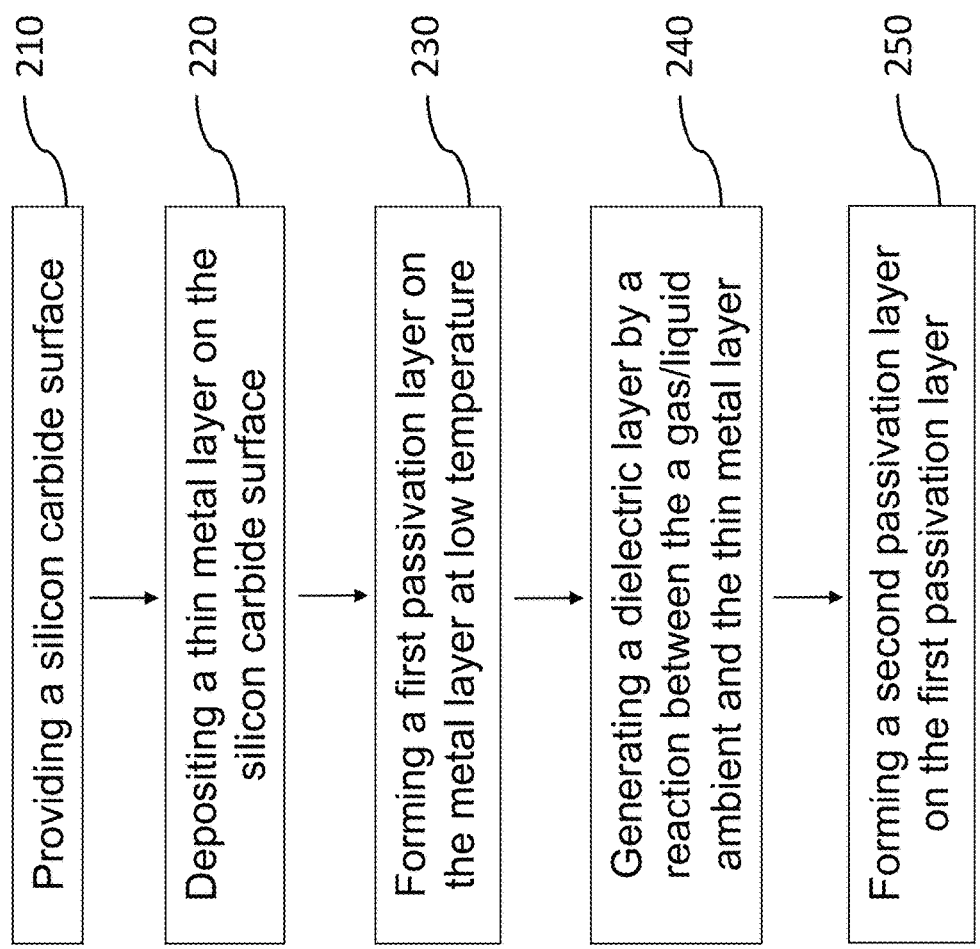
FIG. 2 illustrates a passivation method for a silicon carbide (SiC) surface.

In one aspect, as shown in FIG. 2, a passivation method for a silicon carbide (SiC) surface may include steps of providing a silicon carbide surface 210, depositing a thin metal layer on the silicon carbide surface 220, forming a first passivation layer on the metal layer at low temperature 230, and generating a dielectric layer by a reaction between a gas/liquid ambient and the thin metal layer 240.

In one embodiment, in step 220, the thin metal layer can be deposited on the silicon carbide surface by, but not limited to, sputtering, e-beam evaporation, electroplating, etc. In another embodiment, the metal may include, but not limited to, aluminum, magnesium, etc. In a further embodiment, the passivation layer in step 230 can be a low temperature oxide and/or nitride layer. In still a further embodiment, the dielectric layer generated in step 240 can be aluminum oxide, titanium di-oxide etc., depending on the metal deposited in step 220. The passivation method for a silicon carbide (SiC) may further include a step of forming a second passivation layer on the first passivation layer 250.

It is noted that the thickness of the thin metal layer generated in step 220 is less than 10 nm. In one embodiment, it can range from 10 to 30 angstrom. In another embodiment, the thickness of the passivation layers formed in steps 230 and 250 is usually several microns. In a further embodiment, the thickness of the dielectric layer formed in step 240 can be approximately doubled the thickness of the thin metal layer, e.g. 20 to 60 angstrom.

As discussed above, conventional fabrication processes to generate the oxide layer on the silicon carbide surface are all conducted at high temperature or highly agitated ambient (plasma etc.), so the Si—C atomic bonds 220 would be broken during the fabrication process and C atom residues may be generated, which would adversely affect the performance of the SiC device. In the present invention, a thin metal is deposited on the SiC surface first and a low temperature oxide and/or nitride layer is then formed from the metal layer, so the entire process is conducted in a low temperature environment to preserve the Si—C atomic bonds and to further enhance the performance of the SiC device.

Figure 3:
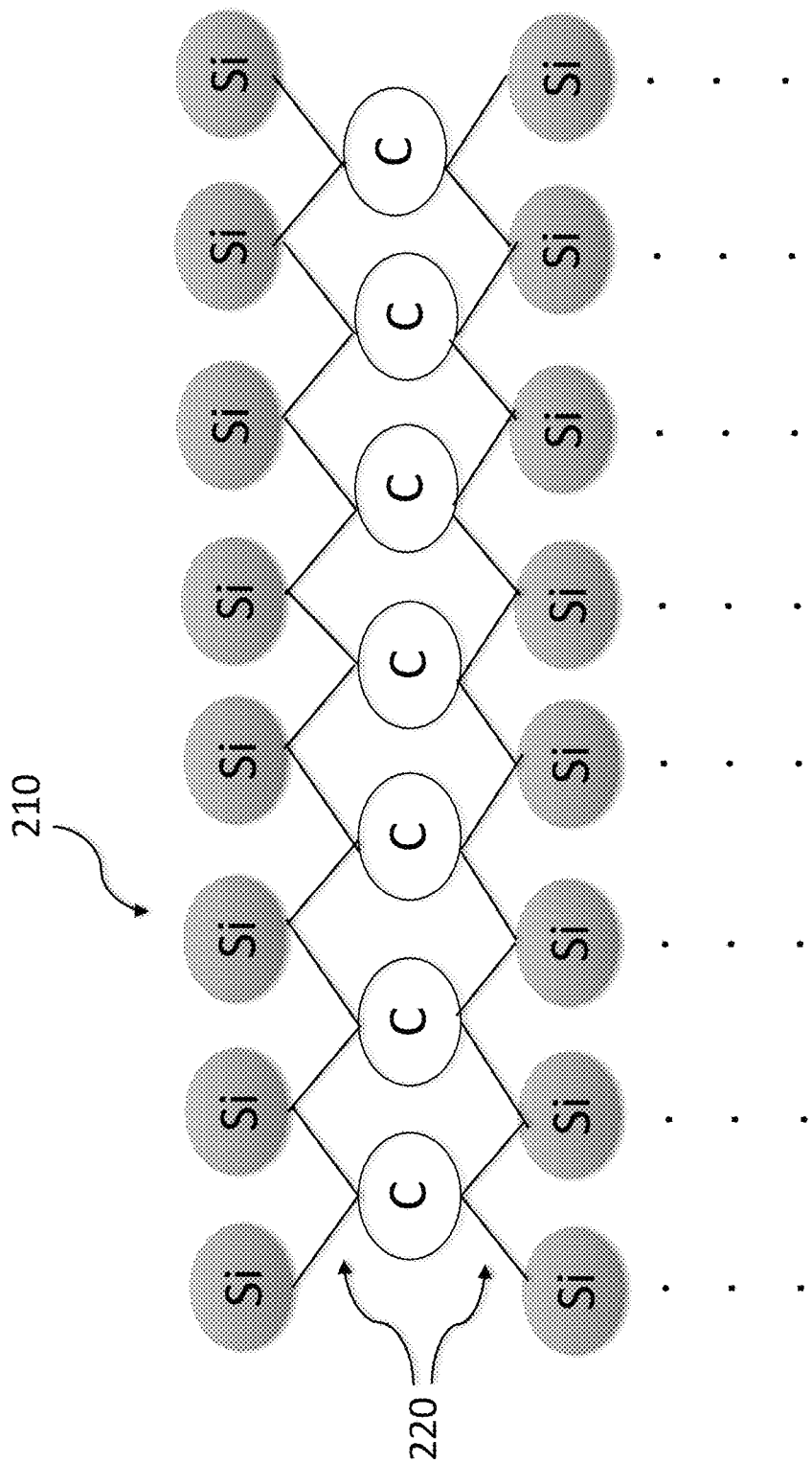
FIG. 3 illustrates a schematic view of a silicon carbide surface in the present invention.
Figure 4:
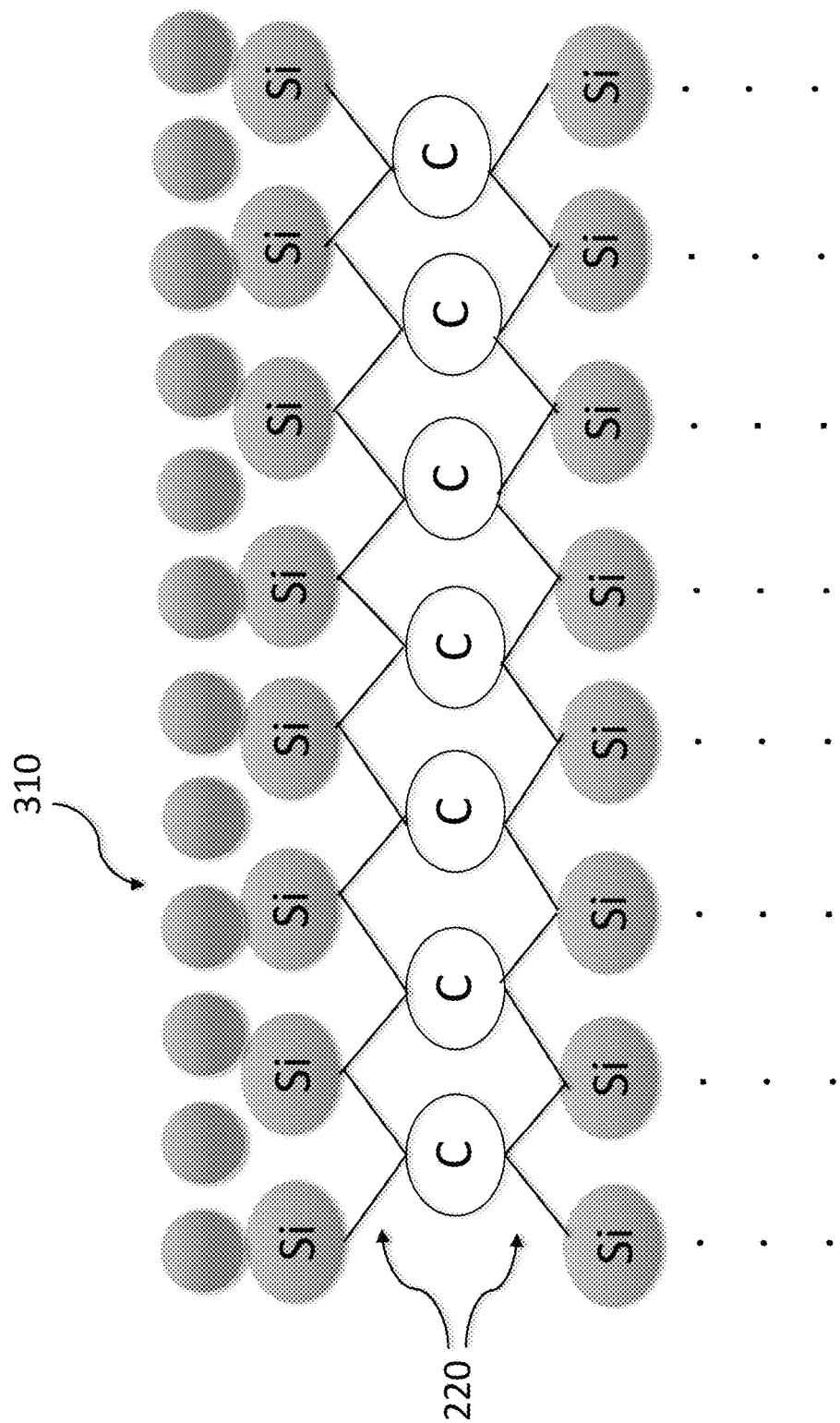
FIG. 4 illustrates a schematic view of a thin metal formed on the silicon carbide surface in the present invention.
Figure 5:
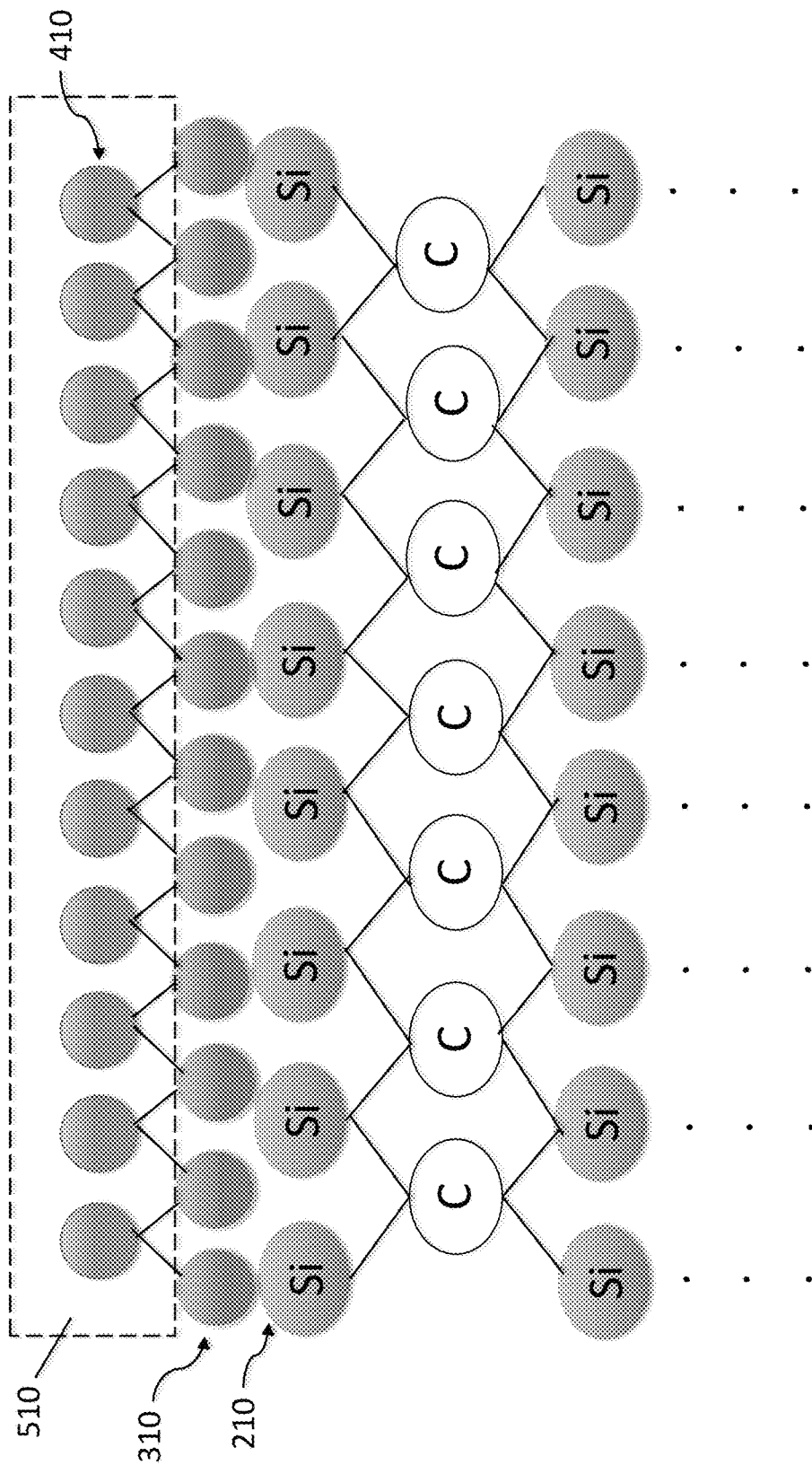
FIG. 5 illustrates a schematic view of a first passivation layer formed on the thin metal layer to generate a dielectric layer in the present invention.
Figure 6:
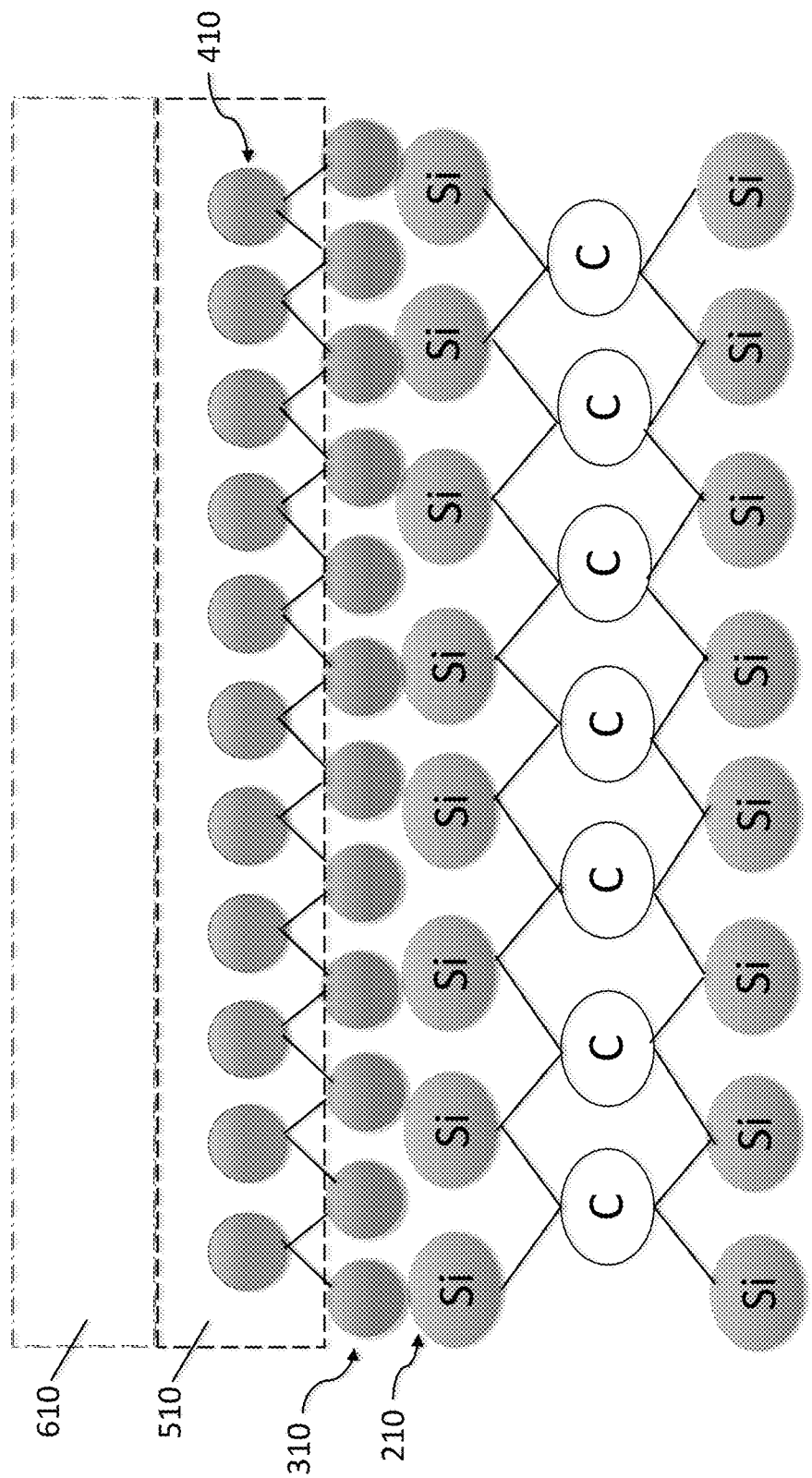
FIG. 6 illustrates a schematic view of a second passivation layer formed on the first passivation layer in the present invention.

In another aspect, as shown in FIGS. 3 to 5, a silicon carbide semiconductor device may include a thin metal layer 310 deposited on a silicon carbide surface 210, and a first passivation layer 510 formed from the metal layer 310 to generate a dielectric layer 410 by the reaction between the metal layer 310 and a gas/liquid ambient. In one embodiment, the thin metal layer 310 can be deposited on the silicon carbide surface by, but not limited to, sputtering, e-beam evaporation, electroplating, etc. In another embodiment, the metal may include, but not limited to, aluminum, magnesium, etc. In a further embodiment, the passivation layer 510 can be a low temperature oxide and/or nitride layer. In still a further embodiment, the dielectric layer 410 can be an aluminum oxide layer created by oxidizing the aluminum layer. As shown in FIG. 6, the silicon carbide semiconductor device may further include a second passivation layer 610 deposited onto the first passivation layer 510.

It is noted that the thickness of the thin metal layer 310 is less than 10 nm. In one embodiment, it can range from 10 to 30 angstrom. In another embodiment, the thickness of the passivation layers 510 and 610 is usually several microns. In a further embodiment, the thickness of the dielectric layer 410 can be approximately doubled the thickness of the thin metal layer, e.g. 20 to 60 angstrom.

Having described the invention by the description and illustrations above, it should be understood that these are exemplary of the invention and are not to be considered as limiting. Accordingly, the invention is not to be considered as limited by the foregoing description, but includes any equivalent.

What is claimed is:

1. A passivation method for manufacturing a silicon carbide-based device comprising providing a silicon carbide substrate that includes a plurality of silicon-carbon atomic bonds; depositing a thin metal layer on the silicon carbide substrate; forming a first passivation layer on the thin metal layer at low temperature to preserve the silicon-carbon atomic bonds without anodizing the thin metal layer; and generating a dielectric layer by a reaction between a gas/liquid ambient and the thin metal layer.

2. The passivation method for manufacturing a silicon carbide-based device of claim 1, wherein the thickness of the thin metal layer is less than 10 nm.

3. The passivation method for manufacturing a silicon carbide-based device of claim 2, wherein the thickness of the thin metal layer is between 10 to 30 angstrom.

4. The passivation method for manufacturing a silicon carbide-based device of claim 1, wherein the thickness of the dielectric layer is approximately doubled the thickness of the thin metal layer.

5. The passivation method for manufacturing a silicon carbide-based device of claim 1, further comprising a step of forming a second passivation layer on the first passivation layer.

6. The passivation method for manufacturing a silicon carbide-based device of claim 5, wherein the thickness of the first and second passivation layers is about several micrometers.

7. The passivation method for manufacturing a silicon carbide-based device of claim 1, wherein the thin metal layer is deposited on the silicon carbide surface by, but not limited to, sputtering, e-beam evaporation, or electroplating.

8. The passivation method for manufacturing a silicon carbide-based device of claim 1, wherein the thin metal layer includes a thin aluminum layer.

9. The passivation method for manufacturing a silicon carbide-based device of claim 1, wherein the thin metal layer includes a thin magnesium layer.

10. The passivation method for manufacturing a silicon carbide-based device of claim 1, wherein the dielectric layer includes aluminum oxide or titanium di-oxide, depending on the material of the thin metal layer.

* * * * *